(12) United States Patent
Sharma et al.

(10) Patent No.: US 9,130,403 B2
(45) Date of Patent: Sep. 8, 2015

(54) SYSTEM, METHOD AND COMPUTER PROGRAM PRODUCT FOR DETERMINING LOAD PROFILES

(75) Inventors: Manu Sharma, Untersiggenthal (CH); Andersson Lars, Kicrchdorf (CH)

(73) Assignee: Current Technologies International GMBH, Magenwil (CH)

( * ) Notice: Subject to any disclaimer, the term of this patent is extended or adjusted under 35 U.S.C. 154(b) by 592 days.

(21) Appl. No.: 13/286,632

(22) Filed: Nov. 1, 2011

(65) Prior Publication Data
US 2013/0110425 A1 May 2, 2013

(51) Int. Cl.
| | |
|---|---|
| G06F 19/00 | (2011.01) |
| G01R 21/133 | (2006.01) |
| H02J 3/26 | (2006.01) |
| G01R 29/16 | (2006.01) |
| H02J 13/00 | (2006.01) |
| G01R 19/25 | (2006.01) |
| G01R 29/18 | (2006.01) |

(52) U.S. Cl.
CPC . *H02J 3/26* (2013.01); *G01R 29/16* (2013.01); *H02J 13/0079* (2013.01); *G01R 19/2513* (2013.01); *G01R 29/18* (2013.01); *Y02E 40/50* (2013.01); *Y04S 20/38* (2013.01)

(58) Field of Classification Search
CPC ....... H02J 3/12; H02J 3/1878; H02J 13/0079; H02J 3/26; G01R 19/2513; G01R 29/16; G01R 29/18; G01R 22/061; G01R 22/063; Y04S 20/38
USPC .............. 702/61, 62, 64, 66, 67, 73, 79, 106, 702/188, 189, 193; 700/298; 340/12.32, 340/825.02, 870.02; 455/402
See application file for complete search history.

(56) References Cited

U.S. PATENT DOCUMENTS

| | | | |
|---|---|---|---|
| 6,115,676 A * | 9/2000 | Rector et al. | 702/62 |
| 8,170,524 B2 * | 5/2012 | Abbot et al. | 455/402 |
| 2009/0265042 A1 * | 10/2009 | Mollenkopf et al. | 700/298 |

* cited by examiner

*Primary Examiner* — John H Le

(57) ABSTRACT

A system, method and device for determining load profile of a power line conductor supplying power to a plurality of power customers is provided. In one embodiment the system includes an automated meter reading system configured to receive meter data including data of the power consumed by each of the plurality of power customers as measured by the power meters; a phase detection system configured to determine one of the plurality of power lines to which each of the power meters is electrically connected; a meter grouping system configured to determine groups of power meter that are commonly connected to the plurality of power line conductors; and a load profile system configured to determine a load profile for each group of power meters by combining the meter data from each meter of each group over a plurality of time periods.

17 Claims, 8 Drawing Sheets

SYSTEM, METHOD AND COMPUTER PROGRAM PRODUCT FOR DETERMINING LOAD PROFILES

FIELD OF THE INVENTION

The present invention generally relates to a system and method for determining the load profiles of power line conductors and portions of such conductors.

BACKGROUND OF THE INVENTION

Electrical power for consumption at residences, offices and other structures is delivered by a power distribution system. The power distribution system (or power grid) typically includes multiple phases and uses a different power line conductor (sometimes referred to herein as phase conductor) to deliver each phase of power. Further, a power distribution system may include numerous sections, which transmit power at different voltages. A section of high voltage power transmission lines forms a power distribution grid for transmitting power from a power plant to substations near populated areas. Various medium voltage (MV) power sections are coupled to the power grid via substations to serve specific regions. An MV power section includes medium voltage power lines carrying power having a voltage in the range of 1,000V to 100,000V. Low voltage (LV) power sections are coupled to the MV power lines via distribution transformers to serve specific groups of structures such as homes. In the United States, the LV power lines typically carry voltages of approximately 120V phase to ground and 240V phase to phase. In most three phase power line systems in Europe, the LV power lines carry 230V phase to neutral voltage, and 400V phase to phase.

The power distribution system includes transformers, switching devices, other devices, and miles of power lines. Maintaining the system in effective working order is imperative for the consumer and society. Maintenance is used to identify signs of potential failure and better manage distribution and redistribution of power to satisfy local needs. Even with such maintenance, however, faults occasionally occur, which typically results in a power outage thereby preventing power delivery. Power outages also may occur due to other events, such as when inclement weather conditions or falling tree branches knock down power lines. It is desirable that the utility operator quickly identify and respond to such power distribution events to minimize the adverse impact to the power distribution system and to the consumers. Statistics show that during faults in the power grid, substantial time is lost in identifying fault location. Thus, it would be desirable to know to which phase conductor a particular device (e.g., each power customer) is connected so that a power outage at a customer premises can more quickly be resolved. In addition, it would be desirable to use such data to determine load profiles of power lines for performing load balancing and other tasks.

Various embodiments of the present invention may satisfy one or more of these needs or others.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities shown. In the drawings.

DETAILED DESCRIPTION OF ILLUSTRATIVE EMBODIMENTS

Figure 1:
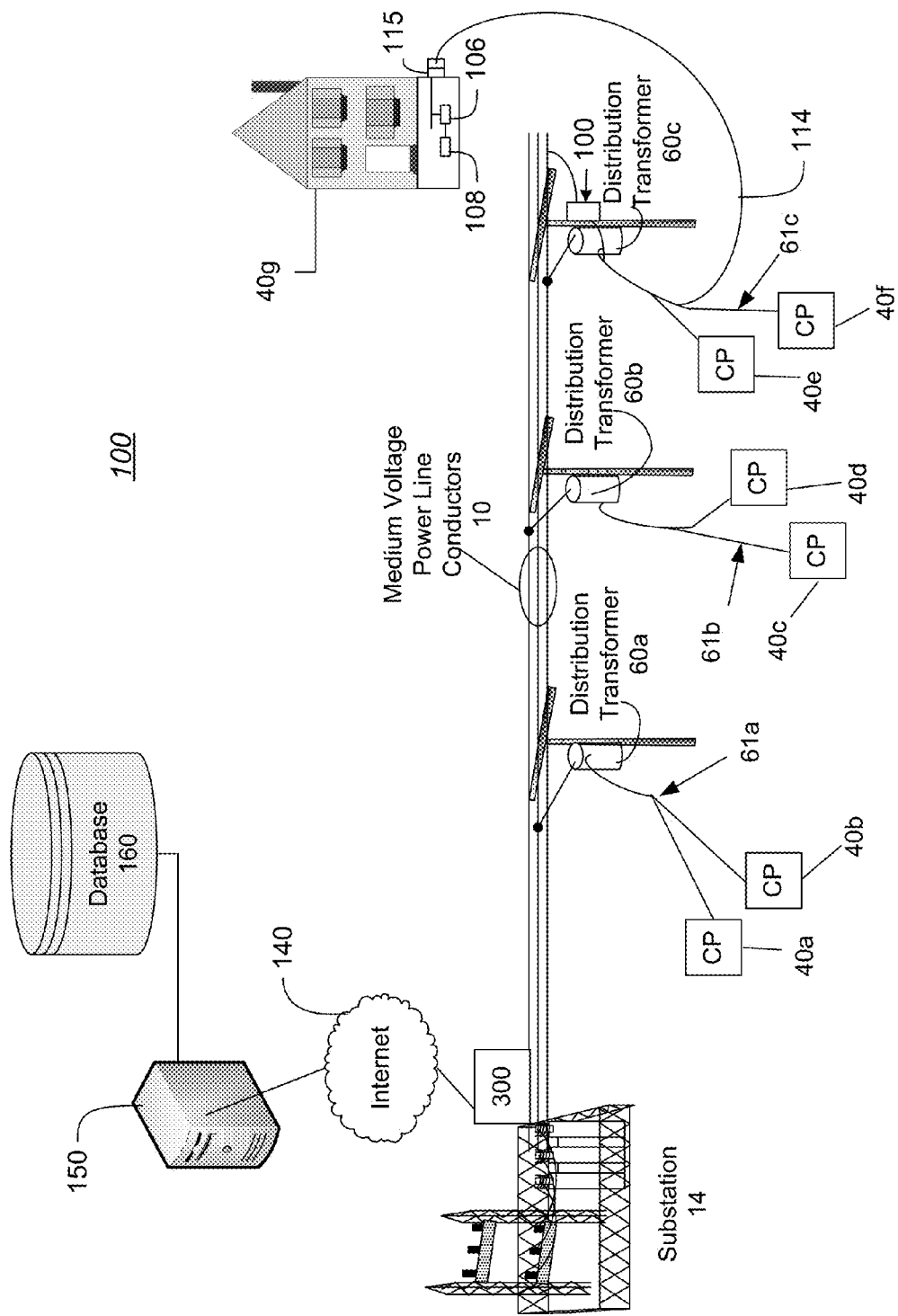
FIG. 1 is a diagram of an example power distribution system with which the present invention may be employed.

In the following description, for purposes of explanation and not limitation, specific details are set forth, such as particular networks, communication systems, computers, terminals, devices, components, techniques, data and network protocols, software products and systems, operating systems, development interfaces, hardware, etc. in order to provide a thorough understanding of the present invention.

However, it will be apparent to one skilled in the art that the present invention may be practiced in other embodiments that depart from these specific details. Detailed descriptions of well-known networks, communication systems, computers, terminals, devices, components, techniques, data and network protocols, software products and systems, operating systems, development interfaces, and hardware are omitted so as not to obscure the description.

The present invention is directed to a system and method for determining to which phase conductor a target device is connected. In one example implementation, a phase identifier message is transmitted at the zero crossing of the voltage of a first phase conductor. The phase identifier message may be transmitted via any communication means and via any communication media provided the implementation is able to meet the real-time requirements of transmitting the message at the zero crossing of the voltage. For example, the transmission may be wireless communications or via power line. Various remote target devices may receive the phase identifier message and also detect the zero crossing of the voltage at the remote target device. It can be determined that devices that receive the phase identifier message at the zero crossing are connected to first phase conductor. In a different embodiment, the relative time between transmission (and reception) of the phase identifier message and the zero crossing of the voltage may be used to identify the phase conductor. The phase conductor may comprise a low voltage phase conductor, a medium voltage phase conductor, a high voltage phase conductor or other phase conductor. The system can be used to determine the phase of any remote device provided the remote device (and/or other device co-located with the remote device) can be configured to receive the phase identifier message and determine the zero crossing of the local (e.g., low) voltage.

Embodiments as disclosed herein may also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures. Combinations of the above should also be included within the scope of the computer-readable media.

While the implementations below are described in the context of a power line communication system; other embodiments may instead use wireless communications. In still other embodiments, some communications may be wireless and other via the power line.

High frequency signals of the power line communications transmitted on only one phase conductor will often cross couple to nearby conductors, including the other phase conductors in a power grid. Consequently, a signal transmitted on one phase conductor may be received by devices connected to other, different phase conductors; thereby preventing use of such a method in determining which phase conductor a device is connected. Embodiments of the present invention make use of the zero crossing of the voltage which is unique to each of the three phases in a three phase system. More specifically, a unique "phase identifier message" is transmitted from a central device at the time of zero crossing of each phase. Thus, devices receiving such a message at a zero crossing of the voltage are connected to the phase onto which that message was transmitted. As discussed, other embodiments may transmit the phase identifier message wirelessly at the zero crossing of each phase.

As shown in FIG. 1, power distribution systems typically include components for power generation, power transmission, and power delivery. In addition to high voltage (HV transmission lines, power distribution systems include MV power lines 10 and LV power lines 114. MV typically ranges from about 1000 V to about 100 kV and, as discussed above. In the United States, the LV power lines typically carry voltages of approximately 120V phase to ground and 240V phase to phase. In the three phase power lines system in Europe the LV power lines typically carry voltages of approximately 230V phase to neutral and 400V phase to phase. Transformers are used to convert between the respective voltage portions, e.g., between the HV section and the MV section and between the MV section and the LV section. Transformers have a primary side for connection to a first voltage (e.g., the MV section) and a secondary side for outputting another (usually lower) voltage (e.g., the LV section). Transformers 60a, 60b, and 60c used between the MV section and the LV section are often referred to as distribution transformers or as step down transformers, because they "step down" the voltage to some lower voltage. Transformers, therefore, provide voltage conversion for the power distribution system. Thus, power is carried from substation 14 to a distribution transformer 60a, 60b, and 60c over one or more MV power lines 10. Power is carried from the distribution transformer to the customer premises such as CP 40a to CP 40g via one or more LV power lines 114.

In addition, a 3-phase distribution transformer will function to distribute three phase voltages to the customer premises, depending upon the demands of the user. In the United States, for example, these local distribution transformers typically feed anywhere from one to ten homes. In the 3-phase European countries, for example, these local distribution transformers typically provide power to 200 to 400 homes, depending upon the concentration of the customer premises in a particular area. Distribution transformers may be pole-top transformers located on a utility pole, pad-mounted Underground Residential Distribution (URD) transformers located on the ground, or transformers located under ground level. Furthermore, and as illustrated in FIG. 1, the distribution system may include two or three (or more) MV power lines 10 that run in parallel with each other (or are buried with each other for underground). Each transformer may be connected to any of the MV power lines 10. Unfortunately, in the U.S. most utilities do not know the MV power line 10 to which each transformer 60 is connected. In addition, most utilities do not know the transformer (or MV phase conductor) to which each customer premises is connected. Similarly, in Europe most utilities do not know to which LV phase conductor each customer premises is connected.

With some modification, the infrastructure of the existing power distribution systems can be used to provide data communication in addition to power delivery, thereby forming a power line communication system (PLCS). In other words, existing power lines that already have been run to many homes and offices, can be used to carry data signals to and from the homes and offices. These data signals are communicated on and off the power lines at various points in the power line communication system, such as, for example, near homes, offices, Internet service providers, and the like. A bypass devices (BD) such as BD 100 shown with distribution transformer 60c is used to communicate data signals around the distribution transformer that would otherwise filter such data signals, preventing them from passing through the transformer or significantly degrading them. Thus, the BD 100 is the gateway between the LV power line subnet 61c (i.e., the LV power line 114 connected to the distribution transformer and the devices that are coupled to the LV power lines) and the MV power line and communicates signals to and from user devices 108 via modem 106 at the customer premises (CP) of the low voltage subnet such as subnet 61c. It should be noted that subnet 61a and subnet 61b typically would have their own bypass device (although they are not shown in the figure). As a general matter a bypass device is capable of providing communication services for the user, which may include security management, routing of Internet Protocol (IP) packets, filtering data, access control, service level monitoring, signal processing and modulation/demodulation of signals transmitted over the power lines.

The PLCS also may include a power line server (PLS) 150, which is a computer system (formed of one or more computers with a memory) for storing a information about the PLCS in a database 160 (i.e., which may form part of the PLS's memory). The PLS 150 may operate as a network element manager (NEM) that monitors and controls the PLCS. The PLS allows network operations personnel to provision users and network equipment, manage customer data, and monitor system status, performance and usage. The PLS may reside at a remote network operations center (NOC), and/or at a PLCS Point of Presence (POP), to oversee a group of communication devices via the Internet. The PLS may provide an identity to the network devices by assigning the devices (e.g., end-user devices, electrical meters, backhaul points, and aggregation points, discussed below) some form of unique addresses. These addresses maybe IP addresses in some implementations, serial numbers in others while still some other unique identifier in other manifestations. In other implementations, the devices MAC address or serial number may be used as the unique identifier/address. The PLS may store this unique network address and other device identifying information (e.g., the device's location, address, serial number, etc.) in its memory. In addition, the PLS 150 may approve or deny user devices authorization requests, command status reports, statistics and measurements from the BDs, and backhaul points (BPs), and provide application software upgrades to the communication devices (e.g., BDs, BPs, and other devices). The PLS 150, by collecting electric power, distribution information and interfacing with utilities' back-end computer systems may provide enhanced power distribution services such as automated meter reading, outage detection, restoration detection, load balancing, distribution automation, Volt/Volt-Amp Reactance (Volt/VAr) management, phase discovery, and other similar functions. The PLS also may be connected to one or more APs and/or core routers directly or through the Internet and therefore can communicate with any of the BDs, user devices, and BPs through the respective AP and/or core router.

The PLCS may further include indoor low voltage repeaters and outdoor low voltage repeaters. Indoor low voltage repeaters may be plugged into a wall socket inside the customer premises such CP 40g. Outdoor low voltage repeaters may be coupled to the external low voltage power line conductors extending from the transformer and therefore, be located between the customer premises and the BD 100. Both the indoor low voltage repeaters and outdoor low voltage repeaters repeat data on the low voltage power line to extend the communication range of the BD 100 and power line modem.

The present invention may be used to determine the phase to which a target device is connected in a power line communication system that provides automated meter reading. Thus, the target devices may comprise automated meters and no end user devices may be present. However, some PLCSs may be implemented to provide internet access to user devices in the customer premises. In such systems, at the user end of the PLCS of, data flow originates from the user device 108, which provides the data to a power line modem (PLM). The user device connected to the PLM may be any device capable of supplying data for transmission (or for receiving such data) including, but not limited to a computer, a telephone, a telephone answering machine, a fax, a digital cable box (e.g., for processing digital audio and video, which may then be supplied to a conventional television and for transmitting requests for video programming), a video game, a stereo, a videophone, a television (which may be a digital television), a video recording device (which may be a digital video recorder), a home network device, a direct load control switch, utility distribution automation equipment, or other device. The PLM transmits the data received from the user device through the LV power lines to a BD 100 and provides data received from the LV power line to the user device. The PLM may also be integrated with the user device, which may be a computer. In addition and as discussed herein, the functions of the PLM may be integrated into a target device 115 like a smart utility meter such as a gas meter, electric meter, water meter, or other utility meter to thereby provide automated meter reading (AMR). In the example is described below the target device comprises an electric utility meter that measures (among other things) power usage for an associated customer premises.

The PLCS may include a backhaul point that acts as a gateway between the PLCS and a traditional non-power line telecommunications network 140 (Internet). One or more backhaul points (BP) may be communicatively coupled to aggregation point (AP) that in many embodiments may be at (e.g., co-located with), or connected to, the point of presence to the Internet. A BP may be connected to an AP using any available mechanism, including fiber optic conductors, T-carrier, Synchronous Optical Network (SONET), or wireless techniques well known to those skilled in the art. Thus, a BP may include a first transceiver suited for communicating through the communication medium that comprises the backhaul link and a power line interface (including a modem) for communicating over a power line. In some embodiments, the BP may be used as a transmission device to transmit phase identifier messages to target devices.

Detailed descriptions of examples of a PLCS, along with system elements such as bypass devices, backhaul points, repeaters (e.g., a bypass device acting as a repeater), power line servers, sensors, other components and their functionality are provided in U.S. Pat. No. 7,224,272, issued May 29, 2007, entitled "Power Line Repeater System and Method," which is incorporated herein by reference in its entirety for all purposes. Additional descriptions of such bypass devices, backhaul points, their components and their functionality is provided in U.S. patent application Ser. No. 11/423,206 filed Jun. 9, 2006, entitled "Power Line Communication Device and Method," which is incorporated herein by reference in its entirety for all purposes.

As discussed, power is often distributed using two or three phases of power carried on separate phase conductors (MV and LV power line conductors) that often run in parallel for extended durations. It would be desirable (in some embodiments) to be able to transmit a signal from the substation down a single power line conductor (i.e., send on only one phase conductor), receive responses from the devices that receive the signal, and conclude that those devices from which responses are received are electrically connected to that phase conductor. However, signals transmitted on a single phase conductor, especially higher frequency signals used for communications, will often cross-couple from one phase conductor to another phase conductor. Consequently, a signal transmitted on one phase conductor may be received by devices connected to other different phase conductors thereby making the above conclusion inaccurate. Similarly, a signal transmitted wirelessly would be received by all the devices within communication range.

Figure 2:
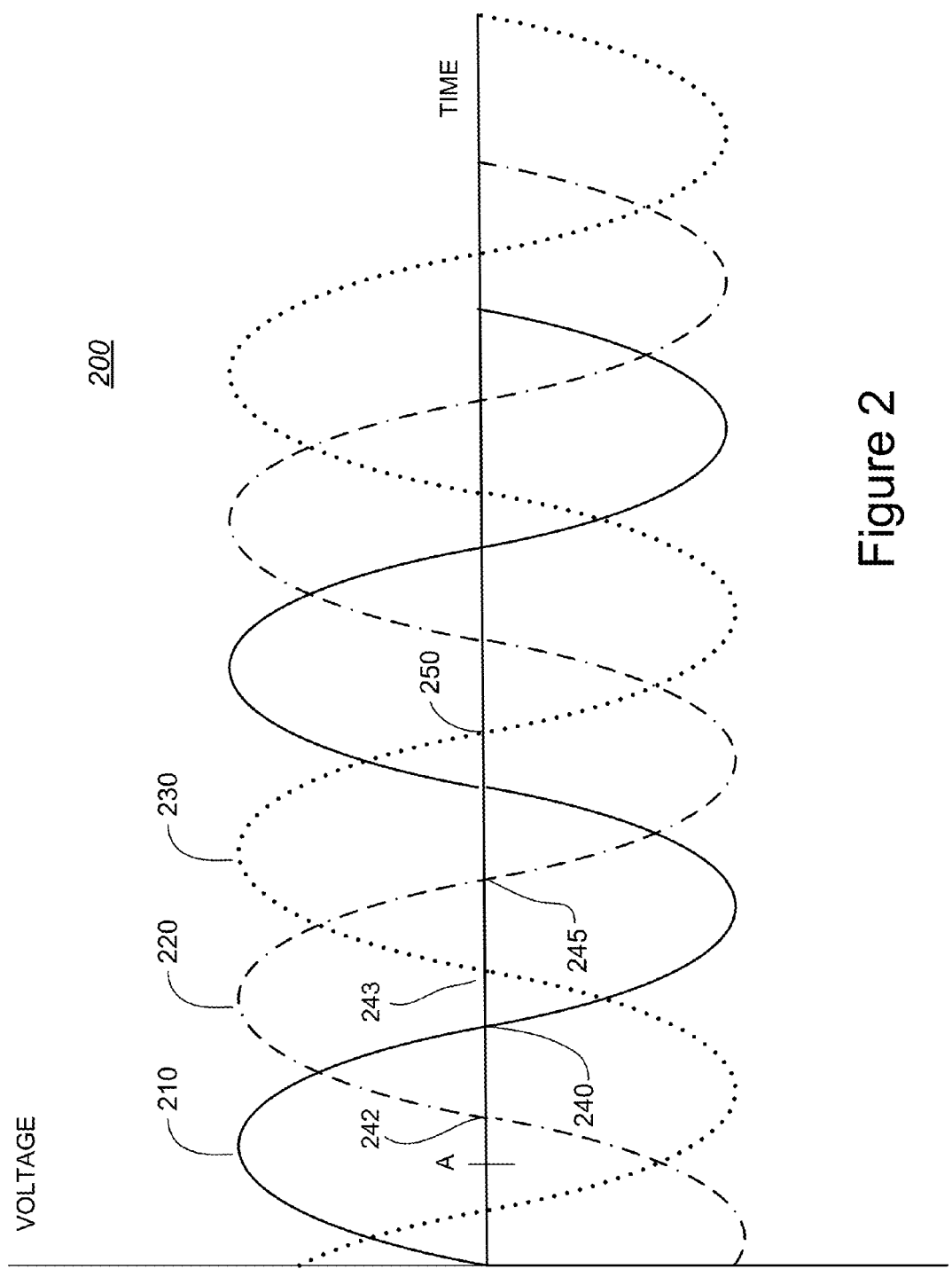
FIG. 2 is a graph of the voltages waveform of three phases of power.

FIG. 2 illustrates the alternating current (AC) voltages for each phase of a three-phase power system such as the phase voltages (Phase A, Phase B, and Phase C) conducted by parallel overhead or underground power lines connected to the same substation or by low voltage power lines (e.g., as in some European countries). Each phase voltage is generally sinusoidal and is 120 degrees shifted from the other phase voltages. For phase A, at moment 240 on the time axis the voltage crosses zero, referred to herein as zero crossing meaning that the voltage is zero. The zero crossing for phase B occurs at moment 245, and the zero crossing for phase C occurs at moment 250. As illustrated, the zero crossing of each phase is different than the zero crossing of the other phases.

Because the zero crossing for each phase is different from the other phases, a message transmitted at a zero crossing of a phase voltage may be used by the receiving device to determine if the message was sent on the phase to which it is connected. At a time when the voltage of a phase is zero, a transmission device may cause a phase identifier message to be transmitted on that phase. In some embodiments, the transmission device may cause three phase identifier messages (PIM) per AC cycle to be transmitted, with each PIM transmitted exactly at the time of the zero crossing of the voltage of its respective phase.

In this embodiment, each phase identifier message is a short message that includes a control code (which is information sufficient for identifying the message as a PIM) and a phase code (and can be considered a data beacon), which is information that is different from the phase codes of the PIMs transmitted in the other phase identifier messages). For example, a first PIM transmitted on a first phase may have a phase code of a one, a second PIM transmitted on a second phase conductor may have a phase code of a two, and a third PIM transmitted on a third phase conductor may contain phase code that is a three. It is worth noting that the phase codes may be arbitrary and need not correspond to the number of phases as in this example. It is also worth noting that the phase identifier messages may be normal data transmissions of the underlying communication system and are not related to synchronization beacons that maybe transmitted on some communication systems.

Figure 3:
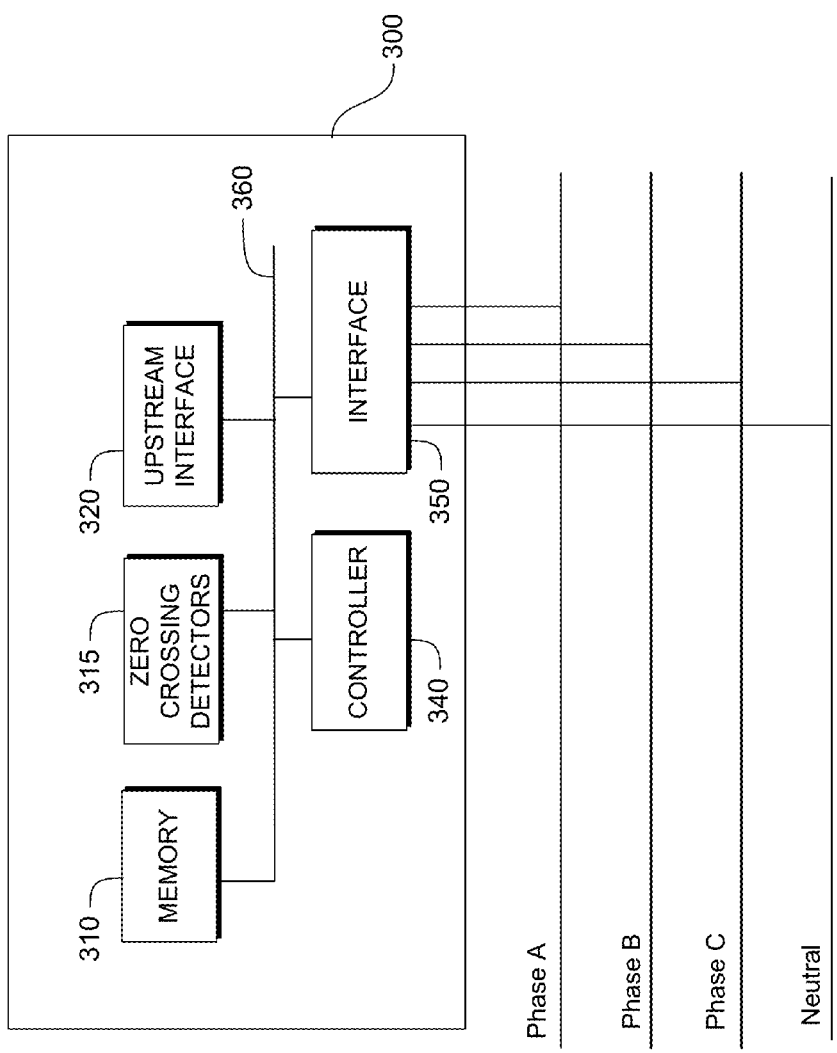
FIG. 3 is a diagram of a transmission device server in accordance with an example embodiment of the present invention.

FIG. 3 is a diagram of an example embodiment of a transmission device 300 used to transmit phase identifier messages in accordance with an example embodiment of the present invention. Such a device may be located at a low voltage side of distribution transformer 60 (e.g., especially in European countries or other location where there are three LV power line phase conductors), at a substation 14, or anywhere along a group of MV power line conductors. In addition, in some embodiments the phase identifier messages may be transmitted by one or more devices already installed at the substation and used for other purposes. In other embodiments, the phase identifier messages may be transmitted by a backhaul point forming part of a PLCS. As shown in the figure, the device 300 is communicatively coupled to a plurality of medium voltage (MV) power line conductors each carrying a different phase of MV power. In other embodiments where a wireless signal is transmitted, the location need only be such that the wireless phase identifier messages are wireless received by all the target devices and that the device 300 can receive the zero crossing information to know when to transmit the phase identifier messages.

As illustrated in FIG. 3, the transmission device may include a controller 340, memory 310, one or more zero crossing detectors 315, a power line interface 350, and an upstream interface 320. The controller 340 executes program code stored in the memory 310 and operates to control the transmission of the PIMs over the phase conductors via the power line interface 350. The zero crossing detectors 315 detects the zero crossing of each phase and allows the controller 340 to transmit each PIM at the appropriate time (at the zero crossing). In other embodiments, the PIMs could be transmitted at other points along the AC voltage curve such as at a peak of the phase voltage.

The upstream interface 320 allows the device 300 to communicate with other devices such as the PLS 150 to thereby receive commands from and transmit information to the PLS 150. For example, the transmission device 300 may transmit PIMs in response to receiving a command from the PLS 150. The PLS may transmit the command to a plurality of transmission devices 300 upon detecting new meters present on the power grid. The upstream interface 320 may comprise a wireless interface (i.e., including a wireless transceiver) or a wired interface (and include a cable modem, fiber optic transceiver, a DSL modem, or any other communication mechanism). The power line interface 350 may include a modem and a power line coupler (in some embodiments) and allows the device 300 to transmit PIMs over the phase conductors, to receive responses from target devices, and to prevent the higher voltage of the phase conductors from gaining accessing to electronics of the device 300.

In the illustrated embodiment, the controller 340 may be implemented with a general-purpose processor. However, it will be appreciated by those skilled in the art that the controller 340 may be implemented using a single special purpose integrated circuit (e.g., ASIC, FPGA) having a main or central processor section for overall, system-level control, and separate sections dedicated to performing various different specific computations, functions and other processes under control of the central processor section. The controller 340 may be a plurality of separate dedicated or programmable integrated or other electronic circuits or devices (e.g., hardwired electronic or logic circuits such as discrete element circuits, or programmable logic devices such as PLDs, PLAs, PALs or the like). The controller 340 may be suitably programmed for use with a general purpose computer, e.g., a microprocessor, microcontroller or other processor device (CPU or MPU), either alone or in conjunction with one or more peripheral (e.g., integrated circuit) data and signal processing devices. In general, any device or assembly of devices on which a finite state machine capable of implementing the procedures described herein can be used as the controller 340.

In practice, the transmission device 300 may be connected to two or more sets of phase conductors (with each set having two or more conductors). The transmission device 300 may store in memory 310 the phase code of each PIM transmitted over each phase conductor. In this embodiment, the transmitted PIMs propagate over the power line conductor, through the distribution transformers to which the power line conductor is connected over the LV external power lines to the client communication devices. In addition, and as discussed above, the PIMs may also cross-couple through the air to other power line conductors, through the transformers connected to these other MV power line conductors (if transmitting over the MV power lines), and over the LV power lines to other the client communication devices. Alternately, the transmission device may transmit from the distribution transformer over the LV phase conductors connected to the distribution transformer (e.g., suitable in many European countries). Similarly, the signals may cross couple from any of the LV phase conductors to another of the LV phase conductors. Referring to FIG. 1, a PIM transmitted from transmission device 300 over the middle phase conductor might be received by the client communication devices at all the customer premises 40a-g even though only distribution transformer 60a and customer premises 40a-b are electrically connected to the middle MV phase conductor. In other embodiments, such as in a system implementing wireless communications, the transmission device 300 need not be connected to any phase conductor but simply receiving information of the zero crossing for each phase in order to transmit the PIM at the zero crossing. In addition, in a different embodiment only a single PIM is transmitted wirelessly and the relative time between transmission (and reception) of the PIM and the zero crossings of the voltages may be used to identify the phase conductor.

In this example embodiment, when a client communication device 400 transmits a notification with the phase code of the PIM it received during a zero crossing, the transmission device 300 (or other device) stores the information in its memory 310 and may transmit information identifying each device and the phase to which it is connected to the PLS for storage in memory (e.g., in database 160) to thereby make the information available for use by other applications such as fault-detection, power outage, and power restoration applications.

In practice, the transmission device 300 may transmit the PIMs when a new device is connected to the power grid and/or at any other suitable time. For example, when an automated meter is installed on the power distribution network, the meter typically will be provisioned onto the communication network (e.g., a wireless network or a PLCS), which may cause the PLS 150 to command the transmission device 300 to transmit the PIMs over the MV phase conductors. The PIMs may also be transmitted after reconfiguration of the network (e.g., via switches, reclosers, or a permanent reconfiguration).

Such PIMs may continue to be transmitted at regular intervals (not necessarily once in every AC cycle) until such time that the newly provisioned client devices transmit a notification indicating receipt of a PIM at a zero crossing. The retransmissions ensure the completion of phase identification even in case of loss of certain transmitted PIMs. Thus, in one of many possible implementations, the transmission device 300 may transmit PIMs for a certain specific time after a new device is provisioned onto the network (e.g., such as after receiving a command from the PLS 150).

Figure 4:
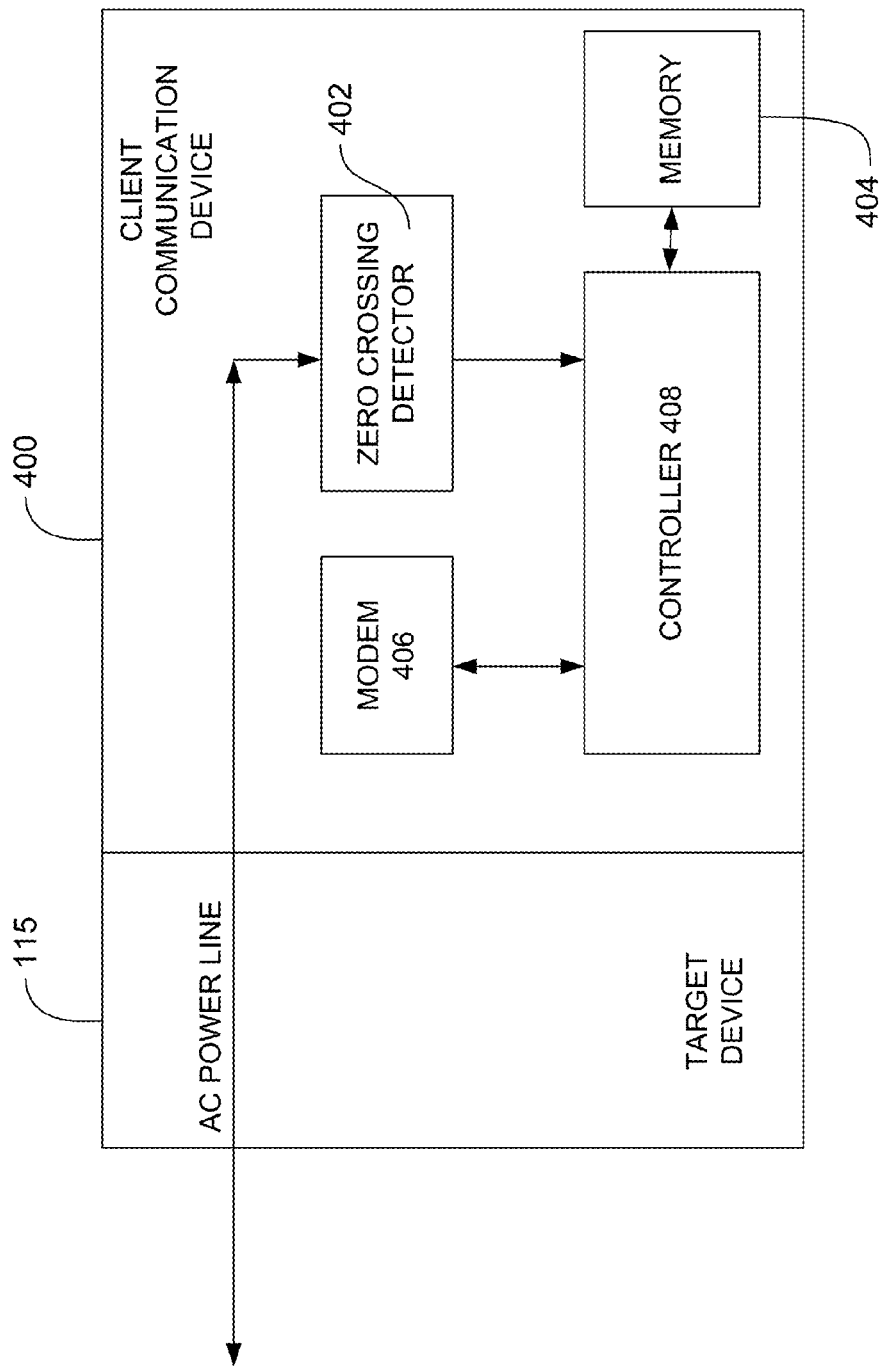
FIG. 4 is a diagram of a client communication device in accordance with an example embodiment of the present invention.

FIG. 4 is a diagram of an example embodiment of a client communication device 400 in accordance with an example embodiment of the present invention. Client communication device 400 is shown forming part of target device 115. In this example, the target device 115 is an electric utility meter configured to provide automated meter reading (AMR). The client communication device 400 receives the PIMs that are transmitted onto power line phase conductors by the transmission device 300. The client communication device 400 may include a memory 404, a zero crossing detector 402, a controller 408, and a modem 406. The client communication device 400 may be placed in the customer premise, at a bypass device, or at any point in the power distribution network where desirable. In this example, the communication device 400 is located at a meter outside (and at) a customer premises. In one implementation, the client communication device 400 may be a circuit card inserted into a meter and in another the device 400 may be disposed in a meter collar. In one embodiment, the modem 406 is used to communicate over the power line and in other embodiments communications may be wireless. Data to be transmitted is provided by the controller 408 to the modem 406 for transmission. Data received by the modem 406 is provided to the controller 408 for processing. Upon receiving data, the controller 408 may examine each message to determine if the message includes a control code indicating the message is a phase identifier message. If the controller 408 determines that data received from the power line or other communication media and provided to the controller 408 by the modem 406 comprises a PIM, the controller must then determine whether that PIM was received during a zero crossing of the voltage by obtaining zero crossing information from the zero crossing detector 402. If the PIM received was not received during a zero crossing of the voltage, the PIM may be discarded by the controller 408. If the PIM was received during a zero crossing of the voltage, the PIM (including its phase code) may be stored in memory 404 and a PIM receipt notification may be transmitted to the transmission device 300 and/or to the PLS 150. The notification may include the phase code and information identifying the target device such as a MAC address, a serial number, or the like.

In the illustrated embodiment, the controller 408 may be implemented with a general-purpose processor. However, it will be appreciated by those skilled in the art that the controller 408 may be implemented using a single special purpose integrated circuit (e.g., ASIC, FPGA) having a main or central processor section for overall, system-level control, and separate sections dedicated to performing various different specific computations, functions and other processes under control of the central processor section. The controller 408 may be a plurality of separate dedicated or programmable integrated or other electronic circuits or devices (e.g., hardwired electronic or logic circuits such as discrete element circuits, or programmable logic devices such as PLDs, PLAs, PALs or the like). The controller 408 may be suitably programmed for use with a general purpose computer, e.g., a microprocessor, microcontroller or other processor device (CPU or MPU), either alone or in conjunction with one or more peripheral (e.g., integrated circuit) data and signal processing devices. In general, any device or assembly of devices on which a finite state machine capable of implementing the procedures described herein can be used as the controller 408. A distributed processing architecture can be used for maximum data/signal processing capability and speed.

Figure 5:
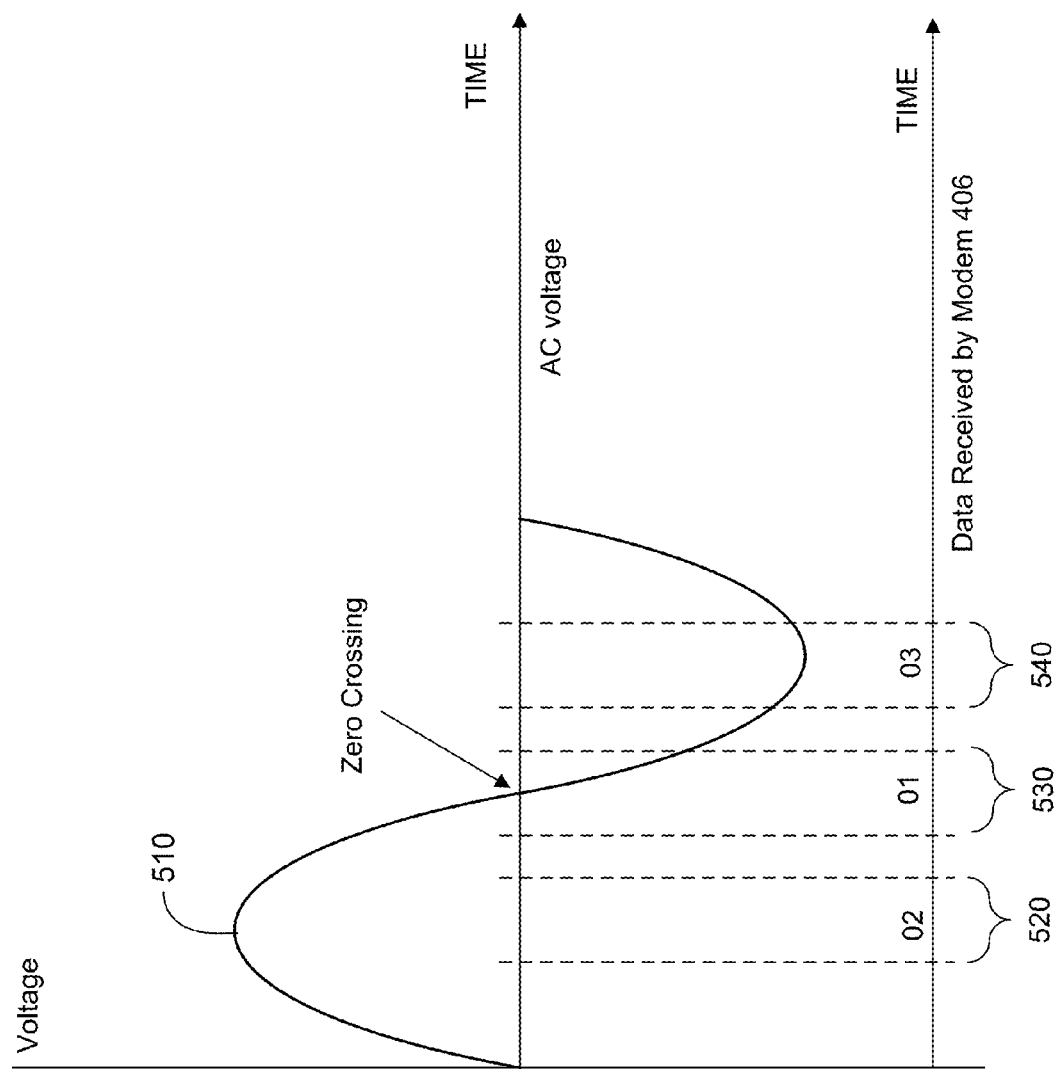
FIG. 5 is a graph of the voltage and three phase identifier messages received at a client communication device in accordance with an example embodiment of the present invention.

FIG. 5 is a diagram of one cycle of the AC voltage versus time and three PIMs received at a client communication device 400 in accordance with an example embodiment of the present invention. In addition, to receiving voltage 510, the client communication device received three PIMs, which each include a unique phase code (01, 02, and 03), that were received at times 520, 530, and 540. As a result of cross coupling, the client communication device 400 has received PIMs that were transmitted on phase conductors to which it is not electrically connected via a transformer. However, the beacons transmitted on other phase conductors will not be received at a zero crossing of the voltage at the target device. As shown in this figure, PIM having a phase code of 01 is the only PIM received at the zero crossing of the voltage and therefore, will be the only PIM received that causes a PIM receipt notification to be transmitted by the device 400. In this example, the PIM is transmitted and received so that the PIM overlaps the zero crossing (i.e., is transmitted and received concurrently with the zero crossing). In other embodiments, it may be transmitted and received so that the PIM substantially immediately follows the zero crossing (i.e., the zero crossing triggers transmission) or substantially immediately precedes the zero crossing. In various embodiments, a portion of the PIM may be transmitted and received within 15 degrees of the zero crossing (before or after), more preferably within 10 degrees of the zero crossing (before or after), still more preferably within 5 degrees of the zero crossing and even more preferably (before or after), and even more preferably concurrently with the zero crossing. It is worth noting that the width of the PIMs shown in FIG. 5 may not be to scale in many embodiments. More specifically, the widths of the brackets may more accurately represent the window during which each PIM may be received.

Figure 6:
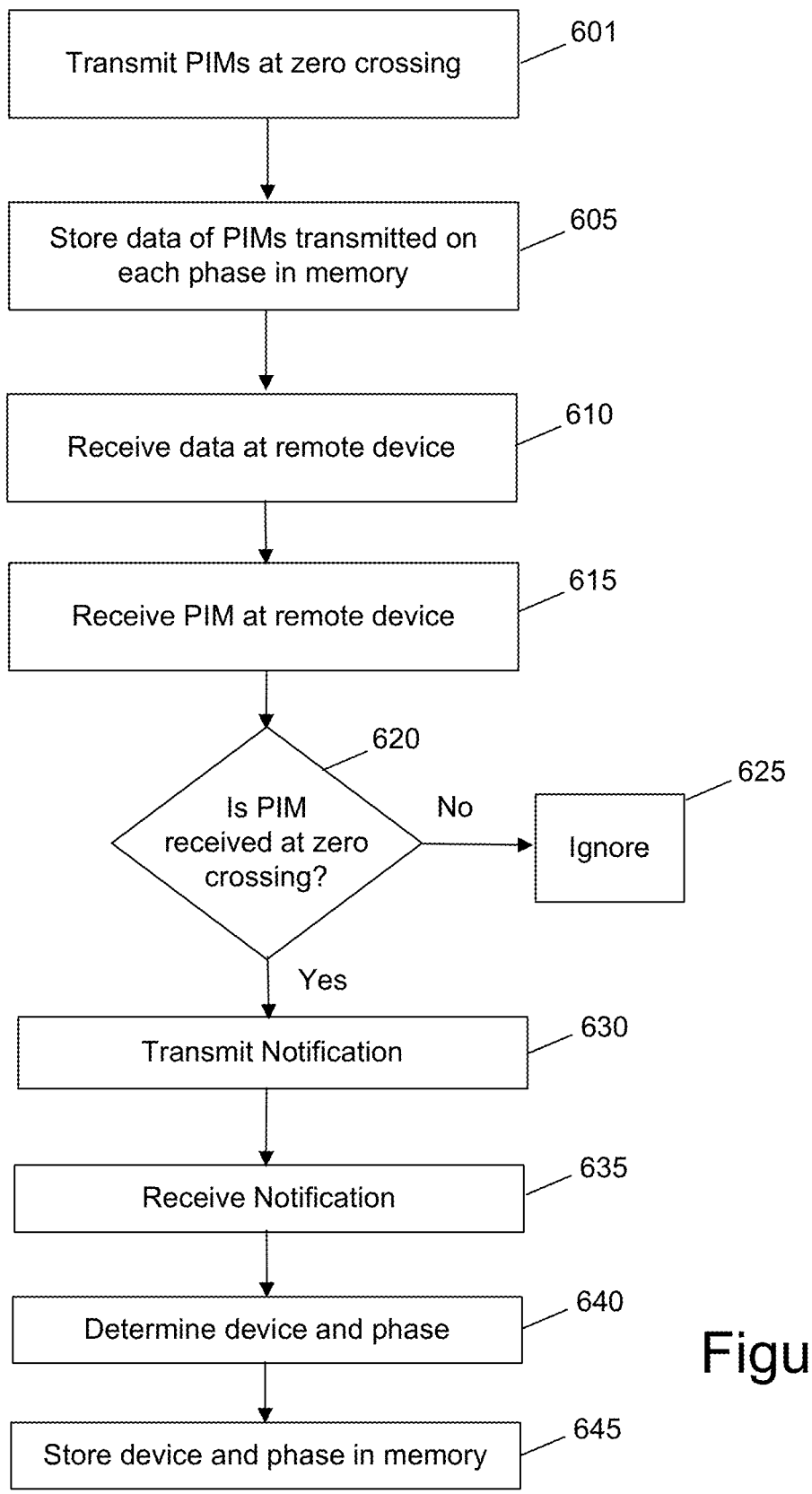
FIG. 6 is a flow chart of a process for practicing an example embodiment of the present invention.

FIG. 6 is a flow chart of an example method according to an example implementation of the present invention. The PIMs are transmitted (e.g., wirelessly or over the phase conductors) at the zero crossing of the voltage of each phase at 601. In addition, before or after process 601, information identifying the phase code in each PIM and the phase having the zero crossing when the PIM is transmitted (or over which it is transmitted if transmitting via power line) is stored in memory at 605 (such as at the PLS or transmission device 300). The client communication device 400 (or other suitable device) may receive data on a regular basis at step 610. At 615, the device 400 receives data and determines that the data comprises a PIM because the received data included a control code of a PIM. At 615, the receiving device then determines whether the PIM was received at a zero crossing of the voltage. If not, the PIM may be ignored at 625. If the PIM is received at the zero crossing of the voltage, the device transmits a notification at 630 over the power line communication system or wirelessly (depending on the implementation). The notification may include information identifying the client communication (or target) device and the phase code (i.e., information identifying the PIM received at the zero crossing). At 635, the transmitted notification is received at a remote computer system such as, for example, the PLS 150 (e.g., after processing by the transmission device 300). At 640, the remote computer system identifies the target device and the phase to which it is connected based on the received information. For example, the target device may be identified by information in the received notification such as a serial number, MAC address, or other identifying information. The phase may be determined by accessing memory to determine the phase over which the phase code (included in the notification) was transmitted. At 645, information of the target device and the phase to which it is connected may be output to a remote device and/or stored in memory in a database 160.

In alternate embodiments, the client communication device may transmit the notification wirelessly (or wired) to the PLS instead of to the transmission device 300. Likewise, in alternate embodiments, the client communication device may transmit the notification wirelessly to the transmitting device instead of using a PLCS and communications to the target devices may be wireless as well. Thus, the transmitting devices and the target device (i.e., the client communication device 400) may include wireless transceivers. For example, the devices may include a 900 MHz transceiver, an IEEE 802.11x transceiver (Wifi), an IEEE 802.16 transceiver (WiMax), a pager transceiver, a mobile telephone network transceiver, or other suitable transceiver. However, care must be taken is using a network because networks add latency and it is important that the client communication device 400 be able to accurately distinguish which of the multiple PIMs are received closest to the zero crossing of the local voltage.

In addition, instead of transmitting the PIMs from the substation or from a backhaul point, a repeater device or any device may also be used to transmit one or more PIMs. In addition, while the above description has focused somewhat on transmitting the PIM over the MV power lines, embodiments of the invention may also be suitable for determining the low voltage power line phase conductor to which a device is connected in three phase LV systems (e.g., in Europe) by transmitting the PIM over the LV power line (or wirelessly).

Figure 7:
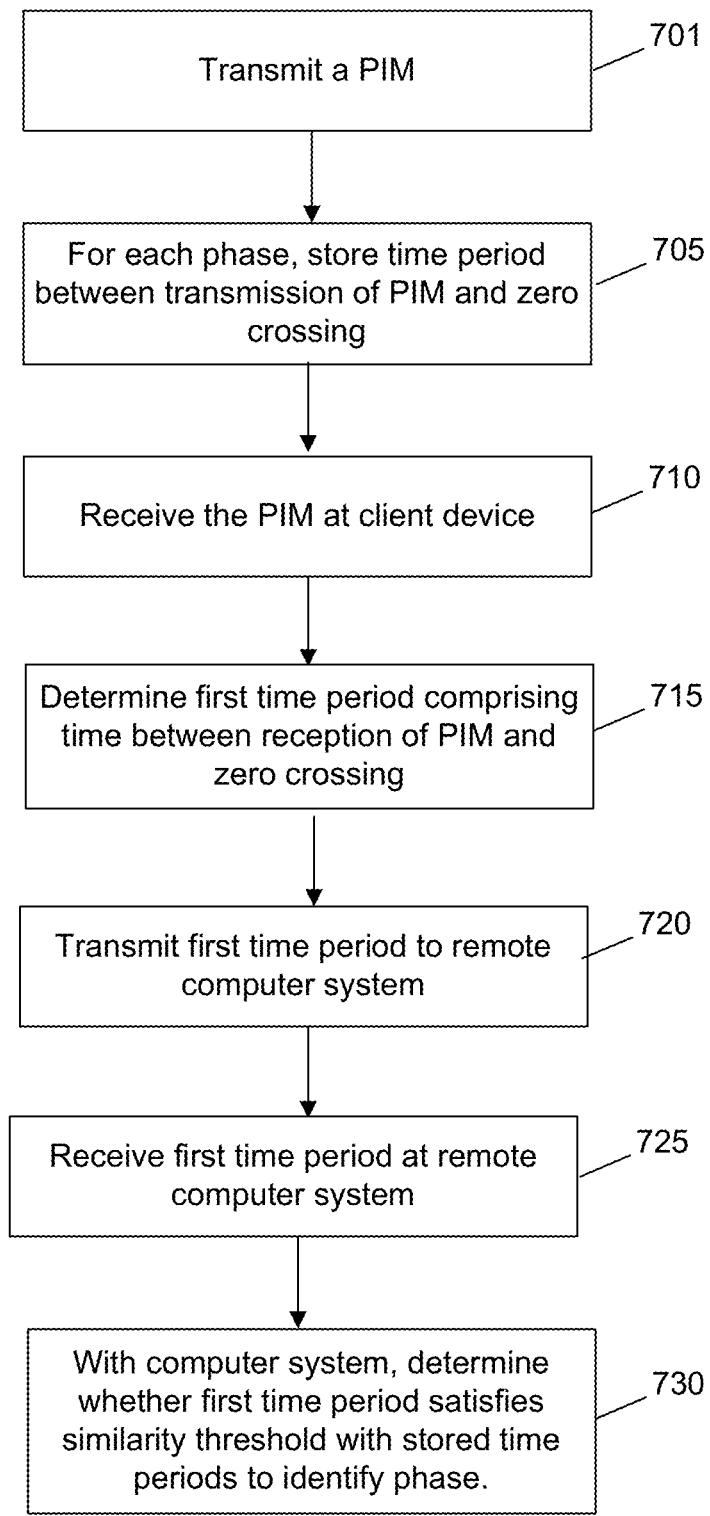
FIG. 7 is a flow chart of another process for practicing an example embodiment of the present invention.

In yet another embodiment illustrated in FIG. 7, the transmitting device 300 wirelessly transmits only a single PIM at 701 and records the time of transmission relative to the zero crossing of the voltage of each of the three phases at 705. Referring to FIG. 2, a PIM may be transmitted at time A indicated on the time axis and the relative timing of the subsequent (or prior) zero crossings of the voltage of each phase may be recorded. For example, the transmission device 300 may store information in memory indicating that the voltage of phase 220 crossed zero 1.85 milliseconds (ms) after transmission of the PIM (at time 242), the voltage of phase 210 crossed zero 4.93 ms after transmission of the PIM (at time 240), and the voltage of phase 230 crossed zero 6.79 ms after transmission of the PIM (at time 243). As is evident from this example, the transmitted PIM is not required to be phase specific or transmitted exactly at any zero crossing times. The transmission device (or other computer system) may use a zero crossing detector 315 for one phase conductor or for each phase conductor in order to obtain data of the time of the zero crossing of the voltage relative to the PIM of each phase conductor to be stored. If only one zero crossing detector 315 is used, the zero crossing of the voltage of the other phases may be computed based on the zero crossing of the one phase conductor. In other embodiments, the zero crossing may be determined by other means. The obtaining and/or the storage of the time of the zero crossing of the voltage of each phase conductor relative to the transmitted PIM may be performed by the transmission device 300 or any device that can collect (or receive) the data. Thus, for example, the transmission device may send the PIM, another device may obtain the necessary timing data, and a third device (e.g., a computer system) may receive the data (from the second device) and store the data in memory.

Upon receiving a PIM at 710, the client communication devices 400 are configured to determine the time duration until the next zero crossing of the voltage at 715. Thus, the devices 400 may include a timer that starts upon reception of a PIM and stops upon detection of a zero crossing as detected by the zero crossing detector 402. The client communication devices 400 may then transmit a notification to the transmission device 300 (or a remote computer system storing the time of the zero crossing of the voltage relative to the PIM for each phase conductor) at 720. The transmission device 300 (or computer system) receives the data at 725. Based on the received data, the transmission device 300 (or remote computer system) may access the information in memory (i.e., the time of the zero crossing of the voltage relative to the PIM for each phase conductor) to determine to which of the three phases the client communication device 400 is connected by comparing the received data with the information associated with each phase in memory at 730. Thus, the process may include determining whether the received timing data satisfies a similarity threshold with the stored timing data at 730.

In the above discussed example and referring to FIG. 2, a client communication device 400 that detects a zero crossing of the voltage 1.85 milliseconds after reception of the PIM will be determined to be on phase 220. A client communication device 400 that detects a zero crossing of the voltage 4.93 milliseconds after reception of the PIM will be determined to be on phase 210. A client communication device 400 that detects a zero crossing of the voltage 6.79 milliseconds after reception of the PIM will be determined to be on phase 230.

In practice, detection of a zero crossing may not occur exactly at the same time (relative to transmission of the PIM) at both the receiving and transmitting ends. Thus, in one embodiment, the phase conductor having the associated stored timing data that is closest to the timing data received from the client communication device 400 is determined to be the phase conductor to which the client communication device 400 is connected. For example, if the timing data from the client communication device is 3 ms (a zero crossing of the voltage 3 milliseconds after reception of the PIM), then the process would determine that the client communication device 400 is connected to phase 220 because 1.85 ms (stored for phase 220) is closer to 3 ms than 4.93 ms (stored for phase 210) or 6.79 ms (stored for phase 230).

In another embodiment, a window of tolerance may be used to determine the correct phase and ensure that the timing data satisfies a similarity threshold. For example, in a sixty hertz system the comparison may determine that the timing data received from each client communication device 400 is within a window of the stored data+/−0.5 milliseconds. Thus, data from a client communication device 400 may be compared with a first window of 1.35 ms to 2.35 ms (1.85 ms+/−0.5) for phase 220, with a second window of 4.43 ms to 5.43 ms (4.93 ms+/−0.5) for phase 210, and a third window of 6.29 ms to 7.29 ms (6.79 ms+/−0.5) for phase 230. Other windows of tolerances (+/−0.25) may alternately be used. If the similarity threshold is not satisfied for any of the stored data for any client communication device 400, another PIM may be transmitted and the process repeated.

In this embodiment, the transmitted PIM may simply include data indicating that the PIM is a PIM (as opposed to other data) but would not include data associated with a particular phase conductor. While the above embodiment measures the time after the transmission and reception of the PIM, other embodiments may instead measure the time period after a zero crossing that the PIM is transmitted and received. Thus, the devices may include a timer that resets to zero at each zero crossing as detected by the zero crossing detector and stops upon receiving (or transmitting) a PIM.

In one embodiment, a method of using a system to determine one of a plurality of power line conductors to which a first remote device is electrically connected and wherein each power line conductor carries a different phase of power having a zero crossing of the alternative current (AC) voltage at a different point in time is provided, The method may comprise transmitting a data beacon; determining a relative time period associated with each power line conductor that comprises a time period between a zero crossing of the voltage of the power line conductor and the transmission of the data beacon; storing in a memory the relative time period associated with each power line conductor; with the first remote device, receiving the data beacon; with the first remote device, determining a first time period comprising a time period between reception of the data beacon and a zero crossing of a voltage at the first remote device; with the first remote device, transmitting data of the first time period to a remote computer system; with the computer system, receiving the data of the first time period; with the computer system, determining that the first time period satisfies a similarity threshold with a relative time period associated with a first power line conductor; and with the remote computer system, storing in a memory information associating the first remote device with the first power line conductor. The method may further comprise with the computer system receiving a plurality of time periods transmitted from a plurality of remote devices connected to different power line phase conductors of the plurality of power line phase conductors. Determining whether the first time period satisfies a similarity threshold may comprises comparing the first time period with the relative time period of each power line conductor. The first remote device may comprise an electric power meter and transmitting the data beacon may comprises wirelessly transmitting. Determining that the first time period satisfies a similarity threshold comprises may comprise selecting the relative time period that is closest to the first time period. Transmitting data of the first time period may comprise wirelessly transmitting data of the first time period. The plurality of power line conductors may comprises medium voltage phase conductors and the first remote device is electrically connected to one of the medium voltage phase conductors via a low voltage power line and a distribution transformer. The plurality of power line conductors may comprise low voltage phase conductors and the first remote device is electrically connected to one of the low voltage phase conductors. The method may further comprise outputting information identifying the first power line conductor as the power line conductor to which the first remote device is electrically connected. The first time period may comprise the time period between reception of the data beacon and a subsequent zero crossing of the voltage at the first remote device. The first time period may comprise the time period between reception of the data beacon and a prior zero crossing of the voltage at the first remote device In one embodiment, a system to determine one of a plurality of power line conductors to which a remote device is electrically connected and wherein at least some of the power line conductors have a zero crossing of an AC voltage of the power carried by the power line conductor at a different point in time is provided. The system may comprise a communication device configured to transmit a phase identifier message; a controller configured to determine a relative time period associated with each power line conductor that comprises a time period between a zero crossing of the voltage of the power line conductor and the transmission of the phase identifier message; a memory configured to store the relative time period associated with each power line conductor; a remote device configured to monitor a voltage of a low voltage power line and to receive the phase identifier message; wherein said remote device is configured to determine a first time period comprising a time period between a the zero crossing of the voltage and the reception of the phase identifier message; wherein said remote device is configured to transmit a notification that includes information of the first time period to a computer system and information identifying the remote device; said computer system configured to select a first power line conductor having an associated relative time period that that satisfies a similarity threshold with the first time period; and wherein sad computer system is configured to output information identifying the first power line conductor. The first time period may comprise the time period between reception of the phase identifier message and a prior (or subsequent) zero crossing of the voltage at the first remote device. The remote device may comprise a controller in communication with a memory and a modem. The communication device may be configured to wirelessly transmit the phase identifier message. The computer system may be configured to select a first power line conductor having an associated relative time period that that satisfies a similarity threshold with the first time period by selecting the power line conductor having an associated relative time period that is closest to the first time period. The computer system may be configured to select a first power line conductor having an associated relative time period that that satisfies a similarity threshold with the first time period by comparing the first time period with the relative time period of each power line conductor. The first remote device may comprise an electric power meter.

For a three phase electricity distribution system to operate in most efficient manner, it is important to maintain equal balance of load on all three electrical phases. Cases where one or two or all three phases have different loads on them result in higher technical losses and pose other problems to the electrical distribution system. Some embodiments of the present invention work automatically at every level of the system and present phase load information to the end-user (e.g., utility). In addition, this phase load information is not a single snapshot of the system at a specific moment in time, but instead comprises ongoing continuous load information. Together with back-end database systems, this information shall be available for historical and analysis engines to take various steps such as to shed loads, switch loads to between phases, and/or other processes based on the load information.

One example embodiment of the system is comprised of the following sub-systems: Phase detection sub-system; Meter load collection sub-system; Meter logical grouping sub-system; and Backend and database sub-system. The Phase detection sub-system is configured to automatically detecting phase of installation of single phase electrical meters and may employ any of the methods and/or systems described herein or others.

The Meter load collection sub-system comprises an automatic meter reading system. In this example embodiment, the meter load collection sub-system is comprised of a plurality of automated meters that measure the power delivered to a plurality of power customers and wherein each automated meter transmits data of the power delivered to its respective power customer to the power line server 150 or other remote computer system. The power delivered to a power customer may be referred to herein as the "load" of, or provided by, the power customer. The meters may have sufficient memory to store a predetermined amount of load information such as for at least a few hours. Each meter may be configured to communicate via one or more communication systems (e.g., power line communication, wireless network communication, etc.) to enable the transmission of the load data to the power line server 150, other remote computer system or a data concentrator.

Some embodiments of the system may include one or more data concentrators communicate with a plurality of meters via the communication system to collect load data. For example, one data concentrator may be designated to collect all of the load data from all of the meters connected to a given power substation. Again, the communication system may include power line communications, mobile telephone communications, IEEE 802.11 wireless communications (Wifi), IEEE 802.16 wireless communications (WiMAX), fiber optic communications, coaxial cable communications, and/or one or more types of communications networks. Depending on the embodiment, the data concentrator may be integrated into, or co-located with, the transmission device 300 (e.g., at the substation). Alternately, the data concentrator may be located at a distribution transformer 60.

The power line server 150 or other remote computer system may receive data from the plurality of automated meters—either directly of via one or more data concentrators and process the received data.

The Meter grouping sub-system is a functional subsystem that may be performed by a data concentrator, the power line server 150 or other remote computer system. This functional subsystem creates logical groups of meters based on the commonly connected meters and represents them as one composite "virtual meter". Such "virtual meters" may exhibit properties similar to a real-meter such as, for example, have a load-profile. In one example embodiment in which a substation supplies power to five sets of three phase conductors, the meters connected to each respective phase conductor may be grouped together to provide fifteen virtual meters. The total power consumed over each time period (e.g., fifteen minutes, one hour, or one day) of a virtual meter; which comprises the combined total power consumed over each time period by all of the meters that form the virtual meter, may be stored and output (e.g., by a load profile system formed by the PLS 150 or other remote computer system). If a virtual meter is constructed for each phase conductor, the total power consumed by a first virtual meter over each time period may be compared to the total power consumed of the other two virtual meters that correspond to the other two (or other) phase conductors to determine if the difference satisfies a predetermined threshold. For example, re-balancing of the loads of the phase conductors may be performed if the difference between the power consumed by a first virtual meter is different from that consumed by a second virtual meter (1) by a first predetermined percentage during any timer period; or (2) by a second predetermined (smaller) percentage for a predetermined plurality of (e.g., five) time periods. Other virtual meters and associated load profiles may be determined for other power line conductors or distribution transformers to the extent the necessary data is available.

Figure 8:
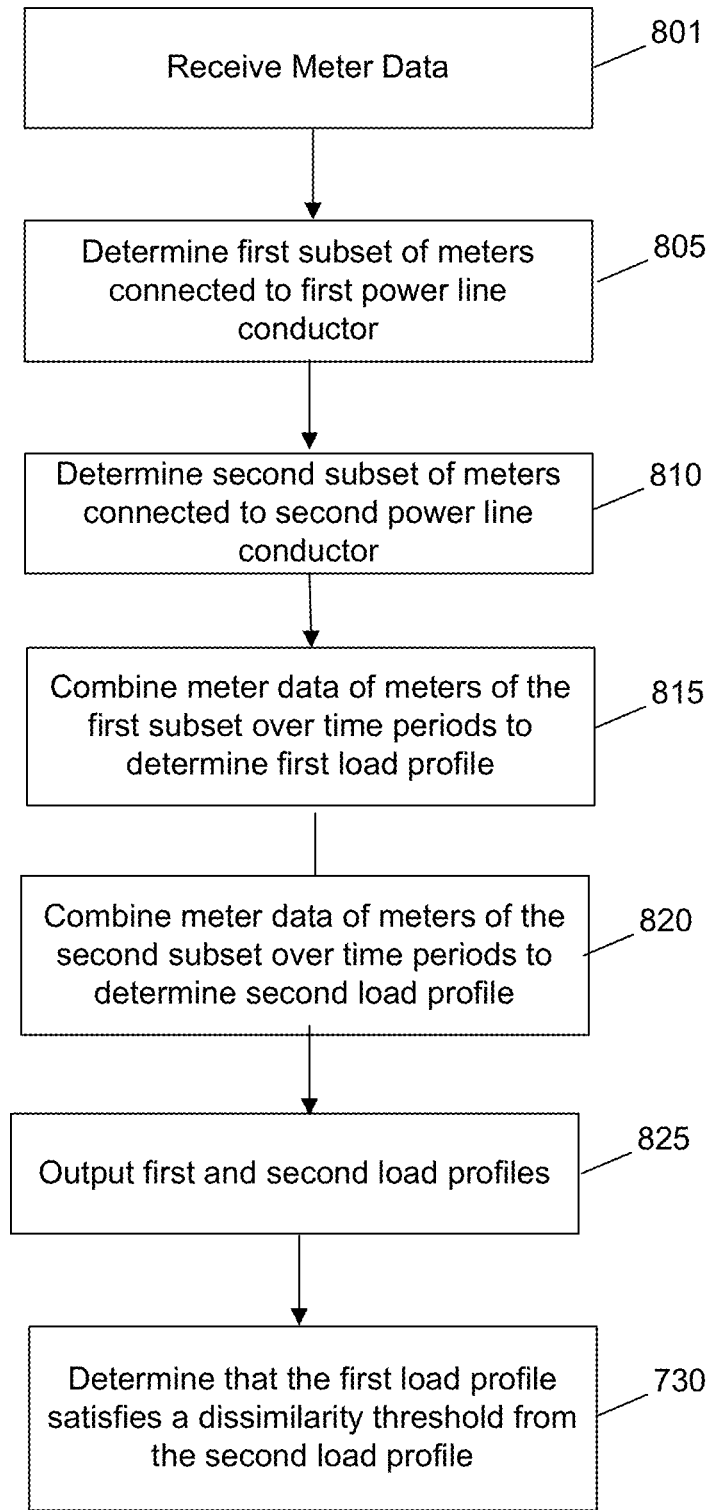
FIG. 8 is a flow chart of another process for practicing an example embodiment of the present invention.

Referring to FIG. 8, one example method of implementing an example embodiment of the present invention includes receiving meter data for a plurality of time periods supplied by each power meter at 801. The meter data supplied by each power meter may comprise data of the power consumed by the power customer associated with the power meter. At 805 the process may include determining a first subset of the plurality of meters electrically connected to a first power line conductor of a plurality of conductors. At 810 the process may include determining a second subset of the plurality of meters electrically connected to a second power line conductor of the plurality of conductors. At 815 the process for each of the plurality of time periods, combining the meter data of each of the meters of the first subset of the plurality of meters to determine a first load profile. At 820, the process may include for each of the plurality of time periods, combining the meter data of each of the meters of the second subset of the plurality of meters to determine a second load profile. At 825, the process may include outputting the first and second load profiles. At 830, the process may include determining that the first load profile satisfies a dissimilarity threshold from the second load profile and, taking appropriate action such as performing load balancing (or load shedding) to reduce the dissimilarity between the load profiles.

In one embodiment, a method of using a system to determine of a load on each of plurality of power line conductors, wherein each power line conductor supplies power to a plurality of power customers and wherein a plurality of meters measure the power delivered to the plurality of customers and wherein each of the plurality of power customers receives power via an associated power meter is provided. The method may comprise receiving meter data for a plurality of time periods supplied by each power meter; wherein the meter data supplied by each power meter comprises data of the power consumed by the power customer associated with the power meter; determining a first subset of the plurality of meters electrically connected to a first power line conductor of the plurality of power line conductors; and determining a second subset of the plurality of meters electrically connected to a second power line conductor of the plurality of conductors. The method may further comprise for each of the plurality of time periods, combining the meter data of each of the first subset of the plurality of meters to determine a first load profile; combining the meter data of each of the second subset of the plurality of meters to determine a second load profile; and outputting the first and second load profiles. The method may further comprise determining that the first load profile satisfies a dissimilarity threshold from the second load profile and, in response to said determining that the first load profile satisfies a dissimilarity threshold from the second load profile, performing load balancing to reduce the dissimilarity between the first and second load profiles, performing load shedding and/or outputting a notification. The method may further comprise determining that the first load profile differs from the second load profile by one or more predetermined amounts over a plurality of the time periods and wherein the one or more predetermined amounts each comprises a percentage. The method may further comprise determining that the first load profile differs from the second load profile by a predetermined amount over one or more time periods and wherein the predetermined amount comprises a percentage. Determining a first subset of the plurality of meters electrically connected to a first power line conductor of the plurality of conductors may comprise: transmitting a phase identifier message; determining a relative time period associated with each power line conductor that comprises a time period between a zero crossing of a voltage of the power line conductor and the transmission of the phase identifier message; storing in a memory the relative time period associated with each power line conductor; receiving the phase identifier message at the plurality of power meters; with the plurality of power meters, determining a first time period comprising a time period between a reception of the phase identifier message and a zero crossing of a voltage at the power meter; transmitting data of the first time period with each power meter to a remote computer system; receiving the data of the first time period at the remote computer system; with the computer system, accessing the memory to determine that the first subset of the plurality of meters is electrically connected to the first power line conductor based on: (a) the relative time period associated with the first power line conductor; and (b) the data of the first time period received from the subset of the plurality of meters.

In another embodiment the system comprises an automated meter reading system configured to receive meter data comprising data of the power consumed by each of the plurality of power customers as measured by the power meters; a phase detection system configured to determine one of the plurality of power lines to which each of the power meters is electrically connected; a meter grouping system configured to determine groups of power meter that are commonly connected to the plurality of power line conductors; and a load profile system configured to determine a load profile for each group of power meters by combining the meter data from each meter of each group over a plurality of time periods. Each of the plurality of power line conductors carries a voltage greater than one thousand volts or two hundred volts.

In another embodiment, a method of for determining a load profile for a plurality of power line conductors and wherein a plurality of loads is connected to each of the plurality of power line conductors via a respective one power meter of a plurality of power meters is provided. The method may comprise receiving meter data comprising data of the power consumed by each of the plurality of power customers as measured by the power meters; determining one of the plurality of power lines to which each of the plurality of power meters is electrically connected; determining groups of power meters that are connected to the same power line conductor; wherein each of the plurality of power line conductors carries a voltage greater than two hundred volts; and determining a load profile for each group of power meters by combining the meter data from each meter of each group for a plurality of time periods. The method may further comprise receiving meter data from a plurality of power meters at a device located at one of the group of a substation and a distribution transformer; and transmitting the received meter data to a remote computer system that performs said determining a load profile. The meter data may be received via communication path that includes a wireless link. The method may further comprise determining that a first load profile satisfies a dissimilarity threshold from a second load profile; and outputting a notification of the dissimilarity. The method may further comprise performing load balancing to reduce the dissimilarity between the first and second load profiles in response to determining that the first load profile satisfies a dissimilarity threshold from the second load profile.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention.

What is claimed is:

1. A method of using a system to determine of a load on each of plurality of power line conductors, wherein each power line conductor supplies power to a plurality of power customers and wherein a plurality of meters measure the power delivered to the plurality of customers and wherein each of the plurality of power customers receives power via an associated power meter; the method comprising:
   receiving, at an automated meter reading system, meter data for a plurality of time periods supplied by each power meter; wherein the meter data supplied by each power meter comprises data of the power consumed by the power customer associated with the power meter;
   determining, at a meter group system, a first subset of the plurality of meters electrically connected to a first power line conductor of the plurality of power line conductors;
   determining, at the meter group system, a second subset of the plurality of meters electrically connected to a second power line conductor of the plurality of conductors;
   for each of the plurality of time periods, combining, at a load profile system, the meter data of each of the first subset of the plurality of meters to determine a first load profile;
   for each of the plurality of time periods, combining, at the load profile system the meter data of each of the second subset of the plurality of meters to determine a second load profile;
   outputting, at the load profile system, the first and second load profiles; and
   determining at the load profile system, that the first load profile differs from the second load profile by one or more predetermined amounts over a plurality of the time periods.

2. The method according to claim 1, further comprising determining that the first load profile satisfies a dissimilarity threshold from the second load profile.

3. The method according to claim 2, further comprising in response to said determining that the first load profile satisfies a dissimilarity threshold from the second load profile, performing load balancing to reduce the dissimilarity between the first and second load profiles.

4. The method according to claim 2, further comprising in response to said determining that the first load profile satisfies a dissimilarity threshold from the second load profile, performing load shedding.

5. The method according to claim 1, wherein the one or more predetermined amounts each comprises a percentage.

6. The method according to claim 1, wherein said determining a first subset of the plurality of meters electrically connected to a first power line conductor of the plurality of conductors comprises:
   transmitting a phase identifier message;
   determining a relative time period associated with each power line conductor that comprises a time period between a zero crossing of a voltage of the power line conductor and the transmission of the phase identifier message;
   storing in a memory the relative time period associated with each power line conductor;
   receiving the phase identifier message at the plurality of power meters;

with the plurality of power meters, determining a first time period comprising a time period between a reception of the phase identifier message and a zero crossing of a voltage at the power meter;

transmitting data of the first time period with each power meter to a remote computer system;

receiving the data of the first time period at the remote computer system;

with the computer system, accessing the memory to determine that the first subset of the plurality of meters is electrically connected to the first power line conductor based on:

(a) the relative time period associated with the first power line conductor; and (b) the data of the first time period received from the subset of the plurality of meters.

7. The method according to claim 6, wherein said transmitting a first phase identifier message comprises wirelessly transmitting.

8. A system for determining a load profile for a plurality of power line conductors and wherein a plurality of loads is connected to each of the plurality of power line conductors via a respective one power meter of a plurality of power meters, the system comprising:

an automated meter reading system configured to receive meter data comprising data of the power consumed by each of the plurality of power customers as measured by the power meters;

a phase detection system configured to determine one of the plurality of power lines to which each of the power meters is electrically connected;

a meter grouping system configured to determine groups of power meter that are commonly connected to the plurality of power line conductors; and a load profile system configured to determine a load profile for each group of power meters by combining the meter data from each meter of each group for a plurality of time periods, said load profile system is configured to determine that a first load profile satisfies a dissimilarity threshold from a second load profile.

9. The system of claim 8, wherein said meter grouping system is configured to determine groups of power meter that are electrically connected to the same conductor of the plurality of power line conductors.

10. The system of claim 8, further comprising a data concentrator configured to receive meter data from a plurality of power meters and to transmit the meter data to a remote computer system that include said load profile system.

11. The system of claim 8, wherein at least some of the meter data is received via communication path that includes a wireless link.

12. The system of claim 8, further comprising a load balancing system configured to performing load balancing to reduce the dissimilarity between the first and second load profiles in response to said load profile system determine that the first load profile satisfies a dissimilarity threshold from the second load profile.

13. The system of claim 8, wherein each of the plurality of power line conductors carries a voltage greater than one thousand volts.

14. A method of for determining a load profile for a plurality of power line conductors and wherein a plurality of loads is connected to each of the plurality of power line conductors via a respective one power meter of a plurality of power meters, the method comprising:

receiving, at an automated meter reading system, meter data comprising data of the power consumed by each of the plurality of power customers as measured by the power meters;

determining, at a meter group system, one of the plurality of power lines to which each of the plurality of power meters is electrically connected;

determining, at the meter group system, groups of power meters that are connected to the same power line conductor; wherein each of the plurality of power line conductors carries a voltage greater than two hundred volts; and determining, at a load profile system, a load profile for each group of power meters by combining the meter data from each meter of each group for a plurality of time periods; and determining, at the load profile system, that a first load profile satisfies a dissimilarity threshold from a second load profile; and outputting a notification of the dissimilarity.

15. The method of claim 14, further comprising receiving meter data from a plurality of power meters at a device located at one of the group of a substation and a distribution transformer; and transmitting the received meter data to a remote computer system that performs said determining a load profile.

16. The method of claim 14, wherein the meter data is received via communication path that includes a wireless link.

17. The method of claim 14, further comprising performing load balancing to reduce the dissimilarity between the first and second load profiles in response to determining that the first load profile satisfies a dissimilarity threshold from the second load profile.

* * * * *